United States Patent
Tomasini et al.

[11] Patent Number: 5,955,895
[45] Date of Patent: Sep. 21, 1999

[54] INTERFACE CIRCUIT FOR BOOSTING CONTROL SIGNALS

[75] Inventors: Luciano Tomasini; Rinaldo Castello; Giancarlo Clerici, all of Milan; Ivan Bietti, Mantova, all of Italy

[73] Assignee: SGS-Thomson Microelectronics S.r.l., Agrate Brianza, Italy

[21] Appl. No.: 08/744,715

[22] Filed: Oct. 29, 1996

[30] Foreign Application Priority Data

Oct. 30, 1995 [EP] European Pat. Off. ............... 9583 455

[51] Int. Cl.⁶ .............................................. H03K 19/0185
[52] U.S. Cl. ................................ 326/88; 326/96; 327/536
[58] Field of Search ................................. 326/83, 88, 96, 326/97; 327/536, 537

[56] References Cited

U.S. PATENT DOCUMENTS

| | | | |
|---|---|---|---|
| 3,824,447 | 7/1974 | Kuwabara | 321/15 |
| 3,925,686 | 12/1975 | Nomiya | 326/96 |
| 4,035,662 | 7/1977 | Kuo | 326/88 |
| 5,066,870 | 11/1991 | Kobatake | 327/537 |
| 5,291,446 | 3/1994 | Van Buskirk et al. | 365/189 |
| 5,394,365 | 2/1995 | Tsukikawa | 327/536 |

OTHER PUBLICATIONS

Electronic Engineering, vol. 61, No. 745, Jan. 1989 London GB, Taylor, et al. "The IR8200 Monolithic DMOS H–Bridge Power Control IC".

Primary Examiner—Jon Santamauro
Assistant Examiner—Don Phu Le
Attorney, Agent, or Firm—Wolf, Greenfield & Sacks, P.C.

[57] ABSTRACT

An interface circuit is disposed between a generator of control signals and a plurality of electronic switches in order to produce boosted voltage signals corresponding to the control signals for activating the electronic switches. To avoid the use of a capacitor with a high capacitance and thus to reduce an area of the integrated circuit, the interface circuit includes a generator of activation signals and a plurality of voltage multipliers each having an input connected to an output of the control signal generator, an output connected to at least one terminal for activating an electronic switch and two control terminals connected to an activation signal generator. Each voltage multiplier includes MOS transistors operatively coupled in series between the input and the output. The MOS transistors operate in response to the activation signals to produce a boosted voltage on the capacitor.

27 Claims, 3 Drawing Sheets

INTERFACE CIRCUIT FOR BOOSTING CONTROL SIGNALS

BACKGROUND OF THE INVENTION

1. Field of the Invention

The present invention relates to an interface circuit disposed between a generator of control signals and a plurality of electronic switches in order to produce boosted voltage signals corresponding to the control signals for activation of the electronic switches.

2. Discussion of the Related Art

In digital integrated circuits, a need to have boosted voltage signals arises from the fact that the so-called "body" effect of MOS transistors requires gate voltages greater than a supply voltage of the circuit. Internal supplies which use voltage multipliers with capacitors are generally provided to produce these gate voltages. To achieve relatively high currents from the multipliers, however, the capacitors have to have correspondingly high capacitances. This constitutes a limitation on producing internal supplies with fully-integrated voltage multipliers since, as is known, the capacitance of an integrated capacitor is directly proportional to the area of semiconductor occupied thereby, as well as to a thickness of the dielectric which is, however, generally fixed by the manufacturing process. Clearly, the need to produce voltage multipliers which can supply large currents conflicts with the need to reduce the dimensions of integrated circuits and hence their cost.

SUMMARY OF THE INVENTION

It is an object of the present invention to provide an interface circuit of a type which does not require a voltage multiplier with a large capacitance for its operation.

This object is achieved, according to the invention, by the provision of an interface circuit operatively coupled between a generator of control signals and a plurality of electronic switches with the interface circuit to produce boosted voltage signals corresponding to the control signals for activation of the electronic switches. The interface circuit includes a generator to generate first and second activation clock signals; and a plurality of voltage multipliers, each of which has an input lead connected to a respective output of the control-signal generator, an output lead connected to at least one electronic switch of the plurality of electronic switches and first and second control leads connected to the activation clock signal generator to receive the first and second activation clock signals, respectively.

Further, each voltage multiplier includes first and second controllable conduction means connected in series with one another between the input lead and the output lead of the voltage multiplier and capacitive means having first and second leads with the first lead connected to a junction between the first and second controllable conduction means. A reference lead common to the multiplier input lead and to the multiplier output lead is also provided and a third controllable conduction means is connected between the second lead of the capacitive means and the reference lead. In addition, a fourth controllable conduction means is connected between the first lead of the capacitive means and the input lead of the voltage multiplier. Activation leads of the first and third controllable conduction means are connected to the first control lead of the voltage multiplier in order to receive the first activation clock signal from the activation clock signal generator. The activation leads of the second and fourth controllable conduction means are connected to the second control lead of the voltage multiplier in order to receive the second activation clock signal from the activation clock signal generator, there being no phase overlapping of the first and second activation clock signals.

Additionally, a method for generating an output level greater than an input level of an input signal includes the steps of, in a first phase of operation, operatively coupling the input signal to a first lead of a charge storing device, operatively coupling a reference level common to both the output level and the input signal to a second lead of the charge storing device and charging the charge storing device to the input level. Further, the method includes, in a second phase of operation that does not overlap in time with the first phase of operation, operatively decoupling the input signal from the first lead of the charge storing device, operatively decoupling the reference level from the second lead of the charge storing device and operatively coupling the input signal to the second lead of the charge storing device to thereby provide the output level at the first lead of the charge storing device greater than the input level.

BRIEF DESCRIPTION OF THE DRAWINGS

A preferred, non-limiting embodiment of the present invention will be described by way of example with reference to the accompanying drawings in which.

DETAILED DESCRIPTION

Figure 1:
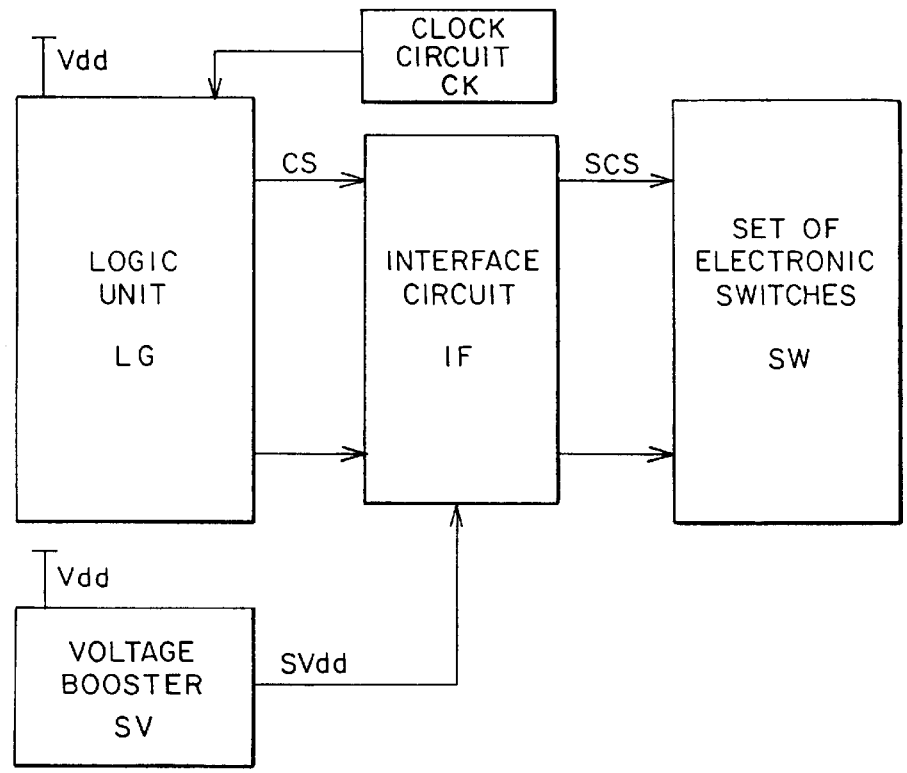
FIG. 1 is a block diagram of a typical circuit unit which includes an interface for producing boosted voltage logic control signals.

FIG. 1 shows a typical circuit unit for producing boosted-voltage logic control signals in an integrated circuit. A booster SV is supplied with a supply voltage Vdd of the integrated circuit and generates a direct-current voltage SVdd greater than the supply voltage Vdd. A logic unit LG is timed by a clock circuit CK and is also supplied with the supply voltage Vdd and produces control signals CS for selectively activating a set of electronic switches SW. An interface circuit IF connected between the logic unit LG and the set of electronic switches SW produces boosted-voltage signals SCS corresponding to the control signals CS of the logic unit LG using the voltage SVdd of the booster SV as a supply voltage.

A circuit structure of the type as shown in FIG. 1, is used, for example, for regulating a gain of a variable-gain amplifier when the regulation has to be carried out in dependence on various operating parameters of the integrated circuit of which the amplifier forms a part.

In this circuit structure, the logic unit LG represents the circuits which receive and process these various operating parameters and the set of electronic switches SW is constituted by a set of controllable conduction means, typically MOS transistors, a closed or open state of each of which affects the gain of the amplifier.

In practice, the boosted voltage signals SCS output by the interface circuit IF are applied to the gate electrodes of the MOS transistors which are either conductive or cut off as a function of the boosted voltage signals SCS. The interface IF is constituted by logic gates typically formed by MOS transistors having their source or drain terminals connected to either of the terminals of the boosted-voltage supply (Svdd and ground). Each time one of these gates switches from one logic state to the other, in order to give rise to a boosted-voltage control signal SCS, a considerable current is absorbed by the booster SV. As a consequence, the booster SV has to be designed so as to be able to supply a maximum current which may be required at any moment and which is, therefore, oversized for most of the actual use of the booster SV. On the other hand, if the size of the booster SV were based on an average current absorption, when a transitory current absorption greater than that tolerable by the booster SV took place, the boosted voltage SVdd would be reduced so that undesired coupling could occur between boosted voltage control signals SCS.

Figure 2:
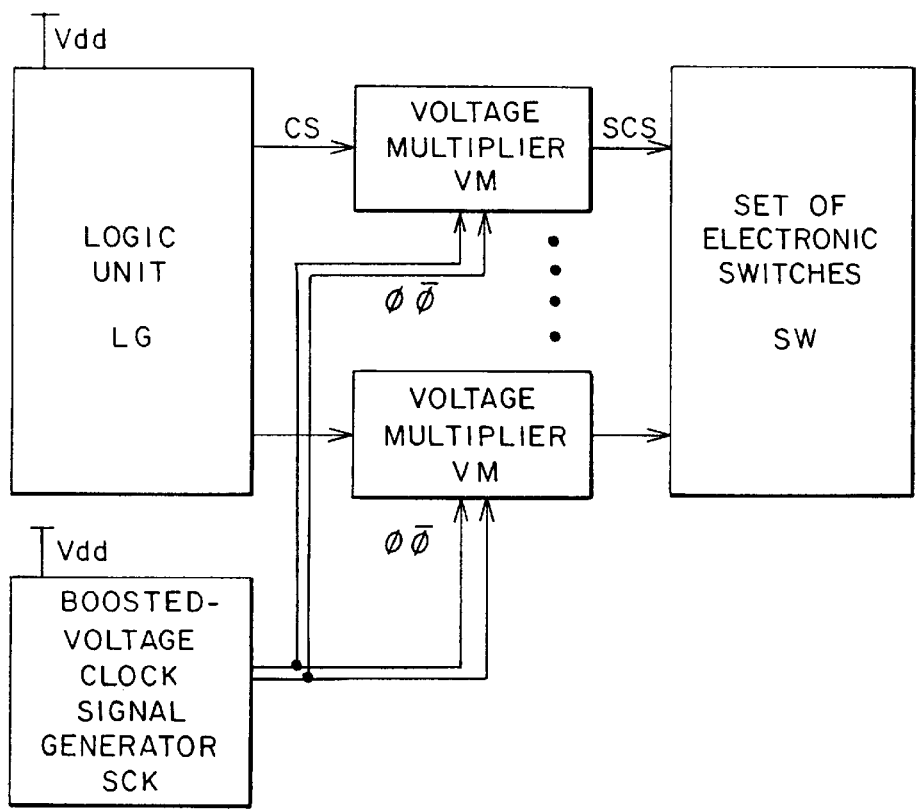
FIG. 2 is a conceptual block diagram of a circuit unit which includes an interface according to the present invention.

According to the present invention as shown in the conceptual block diagram of FIG. 2, in which reference symbols identical to those of FIG. 1 indicate the same components or signals, the interface circuit between the logic unit LG which generates the control signals CS and the set of electronic switches SW is constituted by a plurality of voltage multipliers VM connected between the outputs of the logic unit LG and the terminals for activating the electronic switches SW. Each voltage multiplier VM may be associated with one or more terminals for activating the electronic switches SW. A generator of boosted-voltage clock signals SCK is also provided and controls the individual voltage multipliers VM.

Figure 3:
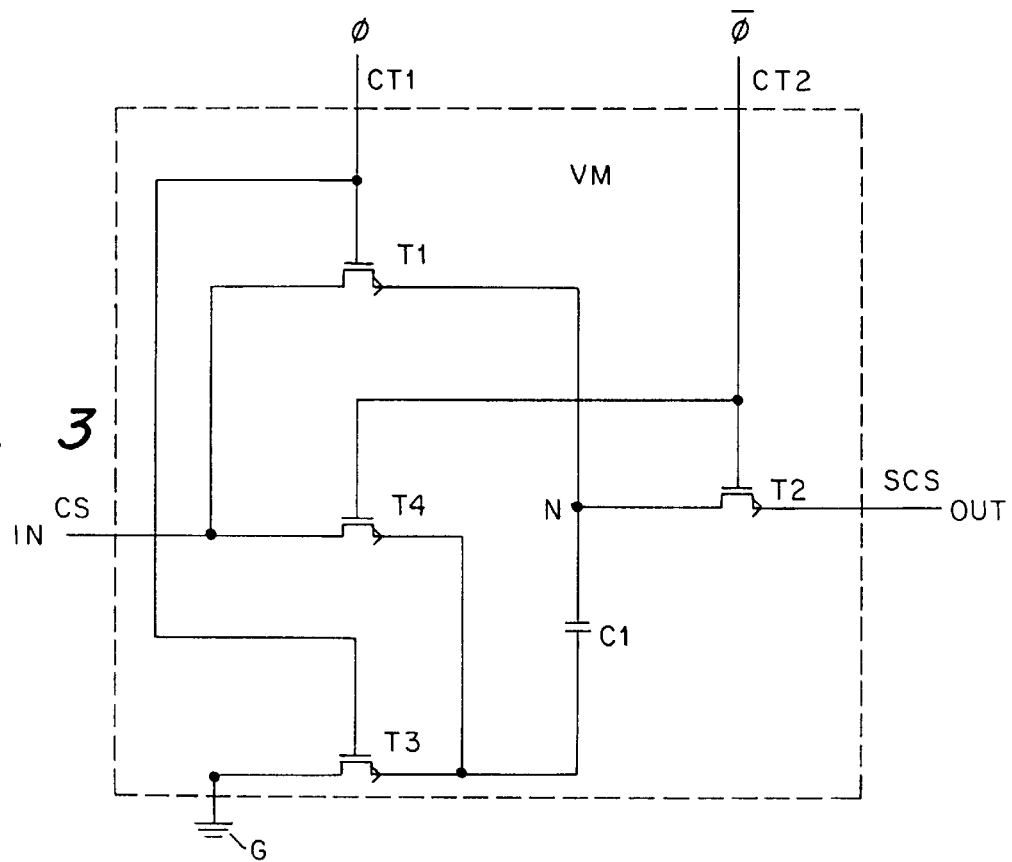
FIG. 3 is a circuit diagram of a first embodiment of an interface according to the present invention.

The circuit structure of a first embodiment of a voltage multiplier VM according to the present invention is shown in FIG. 3. An input lead IN and an output lead OUT of the voltage multiplier VM are connected to one another by source-drain paths, arranged in series, of two N-channel MOS transistors, respectively indicated as T1 and T2. A capacitor C1 is connected between a node N, representing a junction of the source of T1 and the drain of T2, and the source of a third N-channel MOS transistor T3. The drain of MOS transistor T3 is connected to a ground terminal G which is a reference terminal common to the input and the output of the voltage multiplier VM. A fourth N-channel MOS transistor T4 has its source connected to the source of the transistor T3 and its drain connected to the input lead IN. The gate electrodes of the transistors T1 and T3 are connected to a first control terminal CT1 of the voltage multiplier VM and the gate electrodes of the transistors T2 and T4 are connected to a second control terminal CT2 of the voltage multiplier VM.

The control terminals CT1 and CT2 are connected to the boosted-voltage clock generator SCK in order to receive, respectively, first and second activation signals indicated as $\Phi$ and $\overline{\Phi}$. There is no phase overlapping of these activation signals, that is, first and second activation signals $\Phi$, $\overline{\Phi}$ are never both at a high level or both at a low level simultaneously.

Operation of the voltage multiplier VM of FIG. 3 will now be described. When first activation signal $\Phi$ is at a high level and second activation signal $\overline{\Phi}$, therefore, is at a low level, the transistors T1 and T3 are conductive and the transistors T2 and T4 are cut off and the capacitor C1 is charged to the input voltage at the input lead IN, that is, the voltage of the control signal CS. Upon a next change of the first activation signal $\Phi$ to the low level, second activation signal $\overline{\Phi}$, therefore, is at a high level so that the situation is reversed, that is, transistors T1 and T3 are cut off and transistors T2 and T4 are conductive. The capacitor C1 is coupled in series between the input lead IN and the output lead OUT so that the voltage at the output lead OUT, that is, the boosted voltage signal SCS, is a sum of the voltage at the input lead IN and that across capacitor C1, that is, twice the voltage of the input signal CS.

As can be seen, the boosted voltage signals SCS for controlling the electronic switches SW are produced by multiplication by two, i.e., a doubling, of the voltage of the control signals CS output by the logic unit LG. This is accomplished solely by charging gates of MOS transistors using, therefore, much less power than that required by known circuits due to currents drawn by MOS transistors switched into conduction. In summary, with the circuit, as shown in FIG. 3, according to the present invention, it is possible to use capacitors of lower capacitance and hence of smaller area, to the benefit of the final size of the integrated circuit in which it is incorporated.

Figure 4:
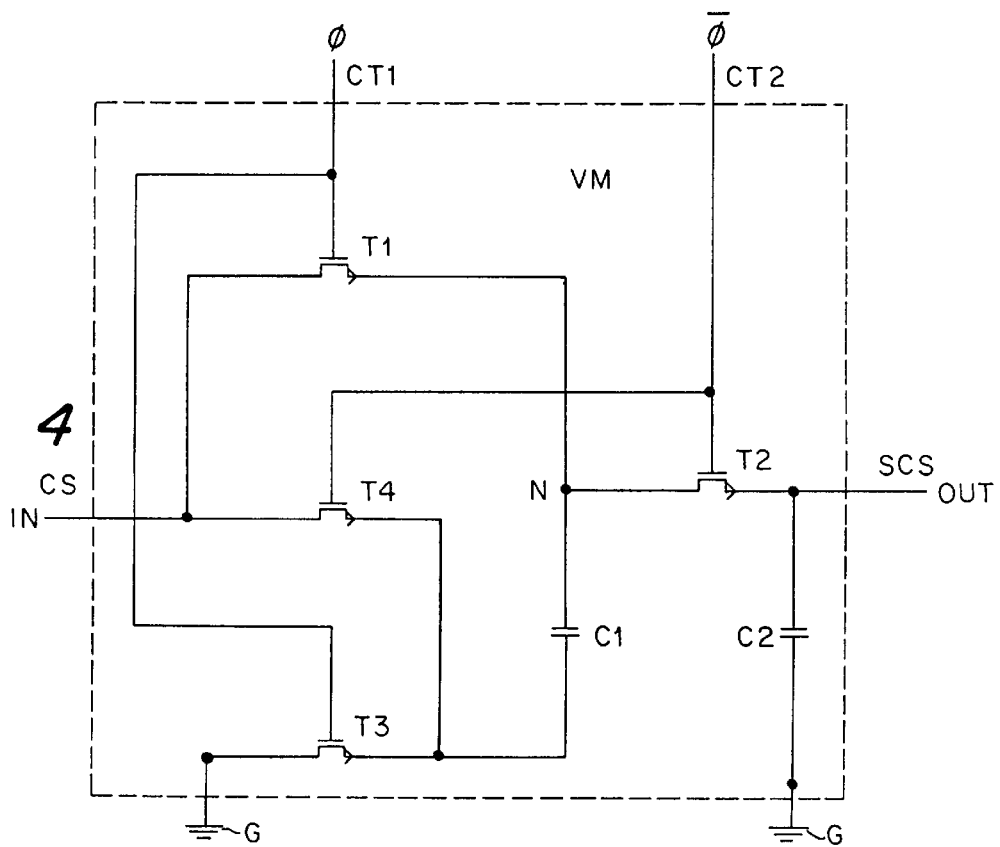
FIG. 4 is a circuit diagram of a second embodiment of an interface according to the present invention.

FIG. 4 shows a second embodiment according to the present invention which can be used advantageously if there is a residual ripple at the output line OUT, due to the first and second activation signals $\Phi$, $\overline{\Phi}$. Such residual ripple could cause injection of charges into the electronic switch SW which is to be activated. According to the second embodiment, an additional capacitor C2 is provided between the output line OUT and the ground terminal G. The additional capacitor C2 acts as a smoothing filter to reduce ripple on the boosted voltage signal SCS.

Figure 5:
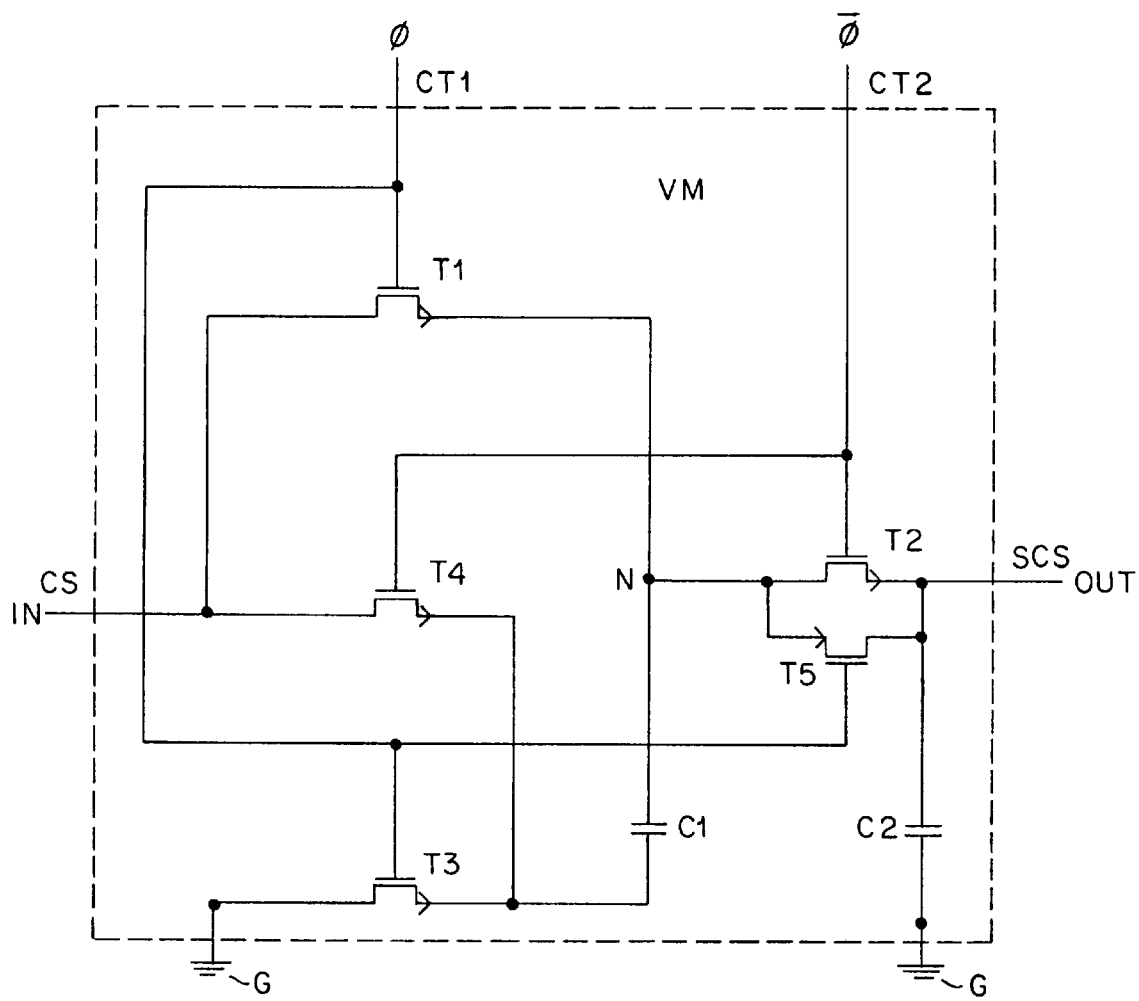
FIG. 5 is a circuit diagram of a third embodiment of an interface according to the present invention.

A third embodiment of the present invention, as shown in FIG. 5, serves to ensure conduction between the node N and the output line OUT when the second activation signal $\overline{\Phi}$ is high and when a conduction threshold of the transistor T2 has increased. Such an increase is due to the body effect which occurs in the transistor T2 when the voltage between its source and drain is twice the voltage of the input signal CS. A P-channel MOS transistor, indicated as T5, is added with its source and drain connected to the drain and source terminals of the transistor T2, respectively, and with its gate electrode connected to the first control terminal CT1. As a result, transistor T5 is made conductive or cut off at the same time as transistor T2.

It should be understood that while some transistors were described as N-channel and others as P-channel, they were only shown as exemplary and could be interchanged to suit a particular application. One of ordinary skill in the art would understand how to implement the present invention using both N-channel and P-channel MOS transistors.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An interface circuit operatively coupled between a generator of control signals and a plurality of electronic switches, the interface circuit to produce boosted voltage signals corresponding to the control signals for activation of the electronic switches, the interface circuit comprising:

a generator to generate first and second activation clock signals: and a plurality of voltage multipliers, each of which has an input lead connected to a respective output of the control-signal generator, an output lead connected to at least one electronic switch of the plurality of electronic switches and first and second control leads connected to the activation clock signal generator to receive the first and second activation clock signals, respectively, wherein each voltage multiplier comprises:

first and second controllable conduction means connected in series with one another between the input lead and the output lead of the voltage multiplier;

capacitive means having first and second leads, the first lead connected to a junction between the first and second controllable conduction means;

a reference lead;

a third controllable conduction means connected between the second lead of the capacitive means and the reference lead;

a fourth controllable conduction means connected between the first lead of the capacitive means and the input lead of the voltage multiplier;

wherein activation leads of the first and third controllable conduction means are connected to the first control lead of the voltage multiplier in order to receive the first activation clock signal from the activation clock signal generator; and wherein activation leads of the second and fourth controllable conduction means are connected to the second control lead of the voltage multiplier in order to receive the second activation clock signal from the activation clock signal generator, there being no phase overlapping of the first and second activation clock signals.

2. The circuit according to claim 1, further comprising an additional capacitive means provided between the output lead of the voltage multiplier and the reference lead.

3. The circuit according to claim 1, wherein:

the second controllable conduction means is an N-channel MOS transistor, and a P-channel MOS transistor is provided with its source and its drain connected, respectively, to the drain and to the source of the N-channel MOS transistor and its gate electrode connected to the first control lead of the voltage multiplier.

4. The circuit according to claim 2, wherein:

the second controllable conduction means is an N-channel MOS transistor, and a P-channel MOS transistor is provided with its source and its drain connected, respectively, to the drain and to the source of the N-channel MOS transistor and its gate electrode connected to the first control lead of the voltage multiplier.

5. The circuit according to claim 1, further comprising:

a fifth controllable conduction means operatively coupled in parallel with the second controllable conduction means and having an activation lead connected to the first control lead of the voltage multiplier.

6. The circuit according to claim 5, wherein:

the first, second, third and fourth controllable conduction means each comprises a MOS transistor of a first channel type; and the fifth controllable conduction means comprises a MOS transistor of a second channel type different from the first channel type.

7. The circuit according to claim 5, further comprising an additional capacitive means provided between the output lead and the reference lead of the voltage multiplier.

8. A voltage multiplier to multiply an input signal having an input level, comprising:

an input lead to receive the input signal;

a reference lead to receive a reference level common to the input signal;

first and second activation leads to receive, respectively, first and second activation signals;

a charge storing device having first and second leads;

a first input charge transfer device having a control lead operatively coupled to the first activation lead, the first input charge transfer device operatively coupled between the input lead and the first lead of the charge storing device;

a reference charge transfer device having a control lead operatively coupled to the first activation lead, the reference charge transfer device operatively coupled between the reference lead and the second lead of the charge storing device; and a second input charge transfer device having a control lead operatively coupled to the second activation lead, the second input charge transfer device operatively coupled between the input lead and second lead of the charge storing device;

whereby, when the first activation signal is at a first level and the second activation signal is at a second level, the input signal is operatively coupled to the first lead of the charge storing device by the first input charge transfer device to charge the charge storing device to the input level and the second lead of the charge storing device is operatively coupled to the reference level; and whereby, when the second activation signal is at the first level and the first activation signal is at the second level, the second lead of the charge storing device is decoupled from the reference level and operatively coupled to the input signal by the second input charge transfer device to provide a voltage level at the first lead of the charge storing device substantially twice the input level of the input signal.

9. The voltage multiplier as recited in claim 8, wherein the charge storing device comprises a capacitor.

10. The voltage multiplier as recited in claim 8, wherein each of the first input charge transfer device, the reference charge transfer device, and the second input charge transfer device comprises an N-channel MOS transistor.

11. The voltage multiplier as recited in claim 8, wherein:

each of the first input charge transfer device and the reference charge transfer device comprises a MOS transistor of a first channel type; and the second input charge transfer device comprises a MOS transistor of a second channel type.

12. The voltage multiplier as recited in claim 11, wherein the first channel type and the second channel type are the same.

13. The voltage multiplier as recited in claim 8, further comprising:

an output lead to provide an output signal; and a first output charge transfer device having a control lead operatively coupled to the second activation lead, the first output charge transfer device operatively coupled between the first lead of the charge storing device and the output lead;

whereby, when the second activation signal is at the first level and the first activation signal is at the second level, the first lead of the charge storing device is operatively coupled to the output lead by the first output charge transfer device to provide the output signal to the output lead.

14. The voltage multiplier as recited in claim 13, further comprising a noise filtering device having a first lead operatively coupled to the output lead and a second lead operatively coupled to the reference lead.

15. The voltage multiplier as recited in claim 13, further comprising:

a second output charge transfer device having a control lead operatively coupled to the first activation lead, the second output charge transfer device operatively coupled between the first lead of the charge storing device and the output lead;

whereby the second output charge transfer device operatively couples the first lead of the charge storing device to the output lead when the first activation signal is at the second level.

16. The voltage multiplier as recited in claim 15, wherein each of the first input charge transfer device, the reference charge transfer device, the second input charge transfer device, and the first output charge transfer device comprises a MOS transistor of a first channel type; and the second output charge transfer device comprises a MOS transistor of a second channel type different from the first channel type.

17. A voltage multiplier, comprising:

an input lead to receive an input signal;

a reference lead to receive a reference level;

a charge storing device having first and second leads;

first means for operatively coupling the input lead to the first lead of the charge storing device and for operatively coupling the reference lead to the second lead of the charge storing device in a first phase of operation and for decoupling the input lead from the first lead of the charge storing device and decoupling the reference lead from the second lead of the charge storing device in a second phase of operation; and second means for operatively coupling the input lead to the second lead of the charge storing device during the second phase of operation and for decoupling the input lead from the first lead of the charge storing device during the first phase of operation;

wherein the first phase of operation does not overlap in time with the second phase of operation.

18. The voltage multiplier as recited in claim 17, wherein the second means comprises:

an output charge transfer device operatively coupled between the first lead of the charge storing device and the output lead; and an input charge transfer device operatively coupled between the input lead and the second lead of the charge storing device.

19. The voltage multiplier as recited in claim 17, wherein the first means comprises:

input charge transfer device operatively coupled between the input lead and the first lead of the charge storing device; and a reference charge transfer device operatively coupled between the reference lead and the second lead of the charge storing device.

20. The voltage multiplier as recited in claim 19, wherein each of the first input charge transfer device and the reference charge transfer device comprises a MOS transistor.

21. The voltage multiplier as recited in claim 19, further comprising:

an output lead to provide an output signal; and third means for operatively coupling the first lead of the charge storing device to the output lead during the second phase of operation to provide the level at the first lead of the charge storing device as the output signal and for decoupling the first lead of the charge storing device from the output lead during the first phase of operation.

22. The voltage multiplier as recited in claim 21, wherein the third means comprises an output transfer device operatively coupled between the first lead of the charge storing device and the output lead.

23. A method for generating an output level greater than an input level of an input signal, the method comprising the steps of:

in a first phase of operation, operatively coupling the input signal to a first lead of a charge storing device, operatively coupling a reference level common to both the output level and the input signal to a second lead of the charge storing device and charging the charge storing device to the input level; and in a second phase of operation that does not overlap in time with the first phase of operation, operatively decoupling the input signal from the first lead of the charge storing device, operatively decoupling the reference level from the second lead of the charge storing device and operatively coupling the input signal to the second lead of the charge storing device to thereby provide the output level at the first lead of the charge storing device greater than the input level.

24. The method as recited in claim 23, further comprising the step of:

in the second phase of operation, operatively coupling the output level at the first lead of the charge storing device to an output line.

25. The method as recited in claim 23, wherein the step of operatively coupling the input signal to the first lead of the charge storing device includes operating a MOS transistor operatively coupled between an input lead and the first lead of the charge storing device.

26. The method as recited in claim 23, wherein the step of operatively coupling the reference level to the second lead of the charge storing device includes operating a MOS transistor operatively coupled between a reference lead and the second lead of the charge storing device.

27. The method as recited in claim 23, wherein the step of operatively coupling the input signal to the second lead of the charge storing device includes operating a MOS transistor operatively coupled between an input lead and the first lead of the charge storing device.

* * * * *

UNITED STATES PATENT AND TRADEMARK OFFICE
CERTIFICATE OF CORRECTION

PATENT NO.    :   5,955,895

DATED         :   September 21, 1999

INVENTOR(S)   :   Luciano Tomasini, Rinaldo Castello, Giancarlo Clerici and Ivan Beitti It is certified that error appears in the above-identified patent and that said Letters Patent is hereby corrected as shown below:

On the title page, Item [30] should read as follows:

[30]       Foreign Application Priority Data
Oct. 30, 1995   [EP]   European Pat. Off.    95830455.2

Signed and Sealed this

Sixteenth Day of May, 2000

*Attest:*

Q. TODD DICKINSON

*Attesting Officer*            *Director of Patents and Trademarks*